United States Patent [19]
Barnes et al.

[11] Patent Number: 5,977,897
[45] Date of Patent: Nov. 2, 1999

[54] RESISTOR STRING WITH EQUAL RESISTANCE RESISTORS AND CONVERTER INCORPORATING THE SAME

[75] Inventors: Paul F. Barnes, Coplay; Ramin Khoini-Poorfard, Allentown, both of Pa.

[73] Assignee: Lucent Technologies Inc., Murray Hill, N.J.

[21] Appl. No.: 08/775,211

[22] Filed: Dec. 31, 1996

[51] Int. Cl.⁶ .................................................. H03M 1/66
[52] U.S. Cl. ........................................ 341/144; 338/283
[58] Field of Search .................................. 344/144, 153, 344/154; 338/283, 287

[56] References Cited

U.S. PATENT DOCUMENTS

| | | | |
|---|---|---|---|
| 4,281,319 | 7/1981 | Roberts, Jr. | 340/347 |
| 4,703,302 | 10/1987 | Hino et al. | 338/293 |
| 4,804,940 | 2/1989 | Takigawa et al. | 341/133 |
| 5,093,661 | 3/1992 | Tanimoto | 341/144 |
| 5,272,457 | 12/1993 | Heckaman et al. | 333/262 |
| 5,534,862 | 7/1996 | Gross, Jr. et al. | 341/144 |
| 5,604,501 | 2/1997 | McPartland | 341/144 |

FOREIGN PATENT DOCUMENTS

| | | | |
|---|---|---|---|
| 0 196 050 | 3/1986 | European Pat. Off. | H01L 21/31 |
| 05063145 | 3/1993 | European Pat. Off. | H01L 27/04 |
| 05235279 | 9/1993 | European Pat. Off. | H01L 27/04 |
| 0 708 532 | 4/1996 | European Pat. Off. | H03M 1/76 |

*Primary Examiner*—Marc S. Hoff
*Attorney, Agent, or Firm*—John P. Veschi

[57] ABSTRACT

An integrated circuit includes a string of substantially similarly-shaped resistive cells, each cell having a first resistive portion and a second resistive portion, the string having an overall orientation and at least one cell, preferably substantially all cells, and more preferably all cells have their respective centerlines oriented at non-orthogonal angles, preferably about 45 degrees, relative to the overall orientation. The cells are contiguous such that a resistor is formed by the first resistive portion of one cell and the second resistive portion of an adjacent cell. The cells preferably have a substantially hexagonal shape and are arranged into substrings. If the string includes a folding point, substrings immediately adjacent to the folding point should include an odd number, preferably three, of cells, and substrings not adjacent to the folding point should comprise an even number, preferably two, of cells. Preferably, the hexagonally shaped cells include two longer sides and four shorter sides, each cell having a tap substantially centrally positioned along one of its longer sides, a resistor being formed between the taps of any two adjacent cells. The taps are preferably arranged to form a grid such that each tap is aligned with at least one other tap substantially parallel to the overall orientation and each tap is aligned with at least one other tap substantially perpendicular to the overall orientation. A converter, such as a digital-to-analog converter (DAC) or an analog-to-digital converter (ADC) includes such a resistor string.

25 Claims, 6 Drawing Sheets

RESISTOR STRING WITH EQUAL RESISTANCE RESISTORS AND CONVERTER INCORPORATING THE SAME

TECHNICAL FIELD

This invention relates generally to integrated circuits having resistor strings with a substantially uniform measure of voltage per unit length of resistive material, and to converters, such as digital-to-analog converters (DACs) and analog-to-digital converters (ADCs), incorporating such a resistor string.

BACKGROUND OF THE INVENTION

Typically a DAC or ADC will require equal resistances for each resistor in a string. Other applications may require a string of resistors wherein the resistance values of the resistors are related, but not necessarily equal. For example, a string having uniform voltage per unit length can be implemented wherein the smallest possible resistance value equals n, and each of the resistors in the string can have a resistance value equal to a multiple of n. A resistor string according to the invention is especially suited for these applications.

DACs are used to convert a digitally coded signal to an analog signal, or in conjunction with successive approximation circuitry as part of an analog-to-digital converter. DACs convert a digitally coded signal to an analog signal, typically a voltage, that correspond, to the digitally coded signal. The analog signal can take on many different values over a predetermined range corresponding to the range of digitally coded signals.

DACs may employ a resistor string comprised of series coupled equal resistance resistors. Between contiguous resistors in the resistor string, as well as between the resistor string and an energy source energizing the resistor string, are intermediate taps. Switches, coupled between an output node and intermediate taps, when turned on, electrically couple the respective intermediate taps to the output node, and when turned off, isolate the intermediate taps from the output node.

The precision with which resistors are formed affects the precision of the resulting analog signal. A critical goal in the design of resistor strings is to reduce the amount of area required for the resistor string. Typically, the resistor string is the bulkiest part of the converter design from a silicon die area perspective. Direction reversals, or folding points, are typically employed to confine the resistor string to a limited area. Another goal is to be able to fabricate a resistor string demonstrating linearity, wherein, for example, each resistor has the same resistance. This goal is particularly elusive when folding points are incorporated into the string. Specifically, it is difficult to design a compact resistor string where the resistors near the folding points exhibit substantially identical resistance to resistors away from the folding points. Gross e, al., in U.S. Pat. No. 5,534,862, incorporated herein by reference, describe one approach to creating a resistor string with equal resistance resistors. However, the Gross et al. approach achieves linearity at the cost of devoting a large amount of area to the resistor string. It is preferable, and in fact mandated by design constraints of many modern applications, that a resistor string exhibit linearity while requiring less area than that required by the Gross et al. approach.

SUMMARY OF THE INVENTION

In accordance with an illustrative embodiment of the invention, an integrated circuit includes a string of substantially similarly-shaped resistive cells forming a resistor string. Each cell has a first resistive portion and a second resistive portion. The centerline of at least one cell is oriented at a non-orthogonal angle, preferably a 45 degree angle, relative to an overall orientation of the resistor string. The cells of the string are contiguous such that a resistor is formed by the first resistive portion of one cell and the second resistive portion of an adjacent cell.

The cells of a resistor string according to the invention can have varying shapes. Preferably, all the cells in a given resistor string have the same shape. It is preferred that this shape be hexagonal, although other shapes are possible, including trapezoidal (i.e. semi-hexagonal). Preferably, the first resistive portion of the one cell comprises substantially half of the resistor, and the second resistive portion of the adjacent cell comprises the other half of the resistor. Each cell further preferably has a tap centrally positioned along one of its longer sides such that a resistor is formed between the taps of two adjacent cells. The taps preferably form a grid wherein each tap is aligned with at least one other tap in each of the vertical and horizontal directions.

DETAILED DESCRIPTION

Figure 1:
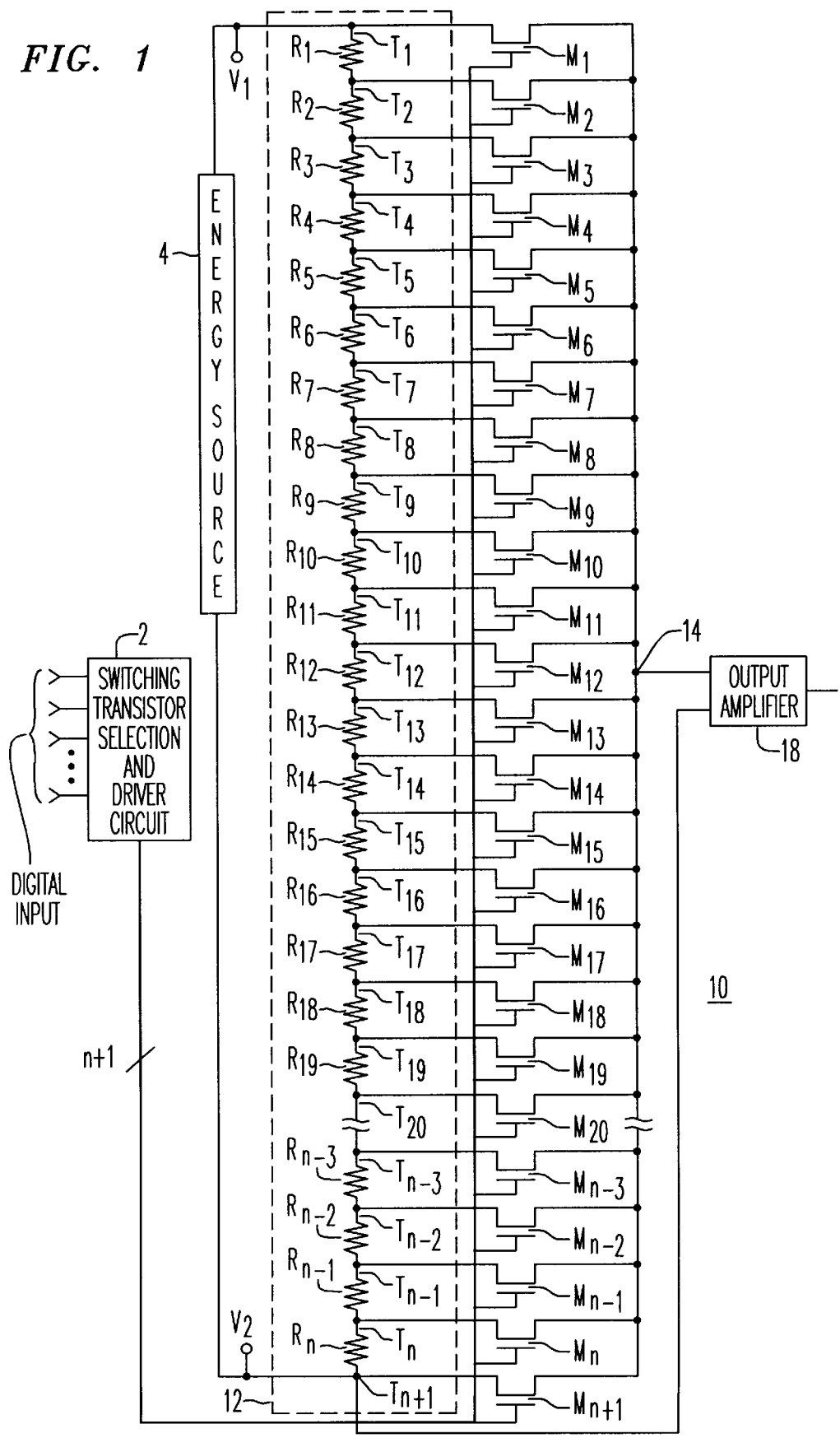
FIG. 1 is a schematic diagram of a digital-to-analog converter in accordance with an illustrative embodiment of the present invention.

The schematic diagram of exemplary DAC 10 incorporating an illustrative embodiment o)f the present invention is shown in FIG. 1. DAC 10 includes a resistor string coupled across an energy source 4. Switches couple intermediate taps to a common output node. The magnitude of an analog voltage appearing at the output node depends upon which switch or switches are turned on. The output may be amplified by an output amplifier which may convert the output to another form. A resistor string in accordance with the present invention is suitable for fabrication in the form of a monolithic integrated circuit.

Resistor string 12 is comprised of a series of resistors. The number of resistors is designated as n, a user determined number. The resistors are denoted $R_1$ through $R_n$. The resistance of the resistors comprising the resistor string are application dependent. The resistance of each resistor $R_1$ through $R_n$ will be readily selected by one skilled in the art based on a variety of parameters such as the power to be dissipated, the potential developed across the resistor string, and the number of resistors in the resistor string.

In an illustrative embodiment, the resistor string is a continuous thin film metal runner that has a sheet resistance per square of metal. A typical sheet resistance value is on the order of 0.04 ohms per square. The resistor string is typically a thin film metal resistor network of aluminum on a silicon integrated circuit. Taps are typically incorporated into the metal runner at substantially equal resistance intervals, preferably at positions outside the current flow path. In FIG. 1 of the illustrative embodiment, the resistor string 12 is shown coupled between two reference potential value, $V_1$ and $V_2$. Resistor string 12 is energized by an energy source 4 that may be either a voltage or current source. For single-ended mode operation, $V_1$ may be substantially the power supply voltage, and $V_2$ may be ground potential.

Switches $M_1$ through $M_{n+1}$ are coupled between corresponding intermediate taps $T_1$ through $T_{n+1}$ and output node 14. In the illustrative embodiment the switches are MOS transistors. Switching transistors $M_1$ through $M_{n+1}$ are controlled by switching transistor selection and driver circuit 2, as is known in the art. Transient capacitor-charging currents due to transistors $M_1$ through $M_{n+1}$ being switched are allowed to go to substantially zero as the circuit settles.

DAC 10 includes a large number of resistors in resistor string 12. The resistor string layout may include a direction reversal, or in some cases many direction reversals, which increase the difficulty of maintaining the resistance of all of the resistors in the string the same. Ideally, a voltage gradient is produced across the resistor string in which the differential voltage across each resistor in the resistor string is substantially identical. Since the current through the resistor string is common to all of the resistors in the resistor string, for the differential voltage across each resistor to be substantially identical, the resistance of each resistor must be substantially identical to the resistance of the other resistors. An intermediate tap, $T_1$ through $T_{n+1}$, is provided at substantially equal resistance intervals along resistor string 12, preferably at a location that is not in the current path. In this manner, the presence of an intermediate tap does not affect current flow through the resistor string.

Figure 2:
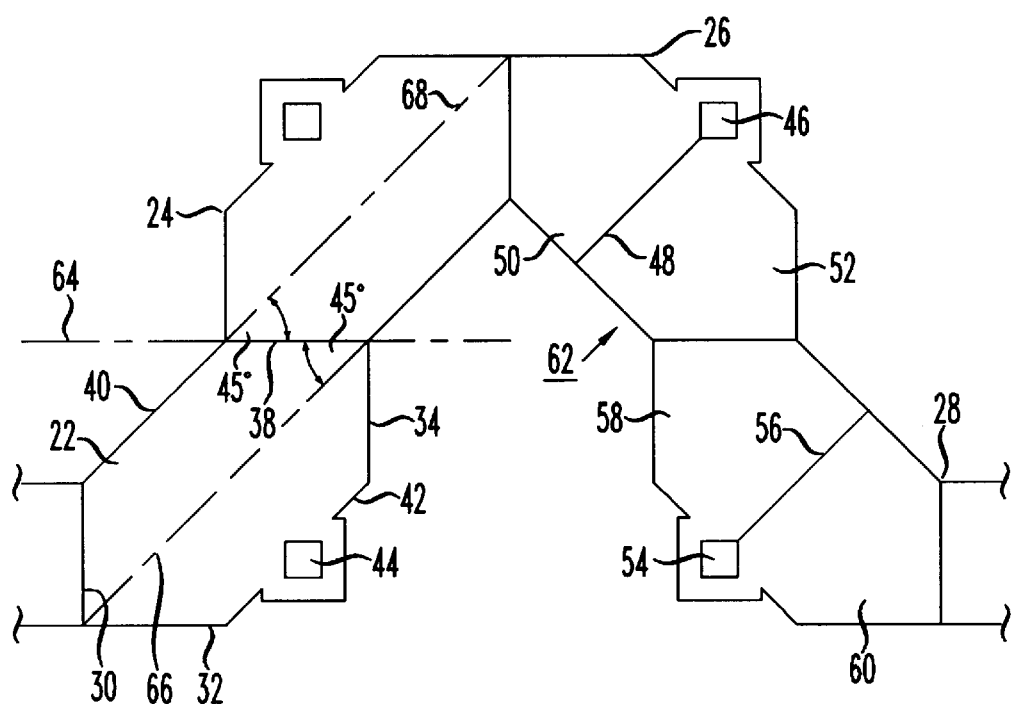
FIG. 2 is a layout diagram of a portion of a resistor string in accordance with an illustrative embodiment of the invention.

FIG. 2 shows a portion of a resistor string, useful for the resistor string 12 of FIG. 1, configured in accordance with the invention. Cells 22, 24, 26 and 28 each have a substantially similar shape. As shown, cells 22–28 each generally have the shape of an extended hexagon, comprising two longer sides and four shorter sides. For example, cell 22 comprises shorter sides 30, 32, 34 and 38, as well as longer sides 40 and 42. Although reference numerals 30 and 38 refer to "sides" of hexagonal cell 22, one of skill in the art understands that cells 22–28 form part of a continuous runner of resistive material. Thus, sides 30 and 38 do not appear as physical demarcations between cells in a physical embodiment according to the invention. These reference numerals and their description as sides of cell 22, as well as similar characterizations referring to other cells, are used herein merely to facilitate an understanding of the shape of a resistive runner in accordance with one illustrative embodiment of the invention.

Generally centered along one of the longer sides, each cell has a tap, such as tap 44 of cell 22. Each cell includes a first resistive portion and a second resistive portion, the region of the cell proximate to the tap serving as a demarcation region between the first and second resistive portions. For example, tap 46 of cell 26 serves to establish boundary 48 between first resistive portion 50 and second resistive portion 52 of cell 26. Similarly, tap 54 establishes boundary 56 between first resistive portion 58 and second resistive portion 60 of cell 28.

Adjacent cells are contiguous along corresponding shorter sides. The first resistive portion of a cell forms a resistor with a contiguous second resistive portion of an adjacent cell between the taps of the two cells. For example, first resistive portion 58 of cell 28 and second resistive portion 52 of cell 26 form a resistor 62 between taps 46 and 54.

As current tends to flow through the resistor string along an inside path, the taps are positioned on each cell along the outer one of the longer sides to keep the taps out of the current flow path as much as possible. The cells shown in FIG. 2 are a portion of a string oriented from left to right across the page. The overall orientation of this portion of the string is thus along axis 64. At least one cell, preferably substantially all of the cells, and still preferably every cell, has a centerline that is oriented at a non-orthogonal angle, preferably about a 45 degree angle, with respect to axis 64. For example, centerlines 66 and 68 of cells 22 and 24 are respectively shown forming 45 degree angles with axis 64.

Figure 3:
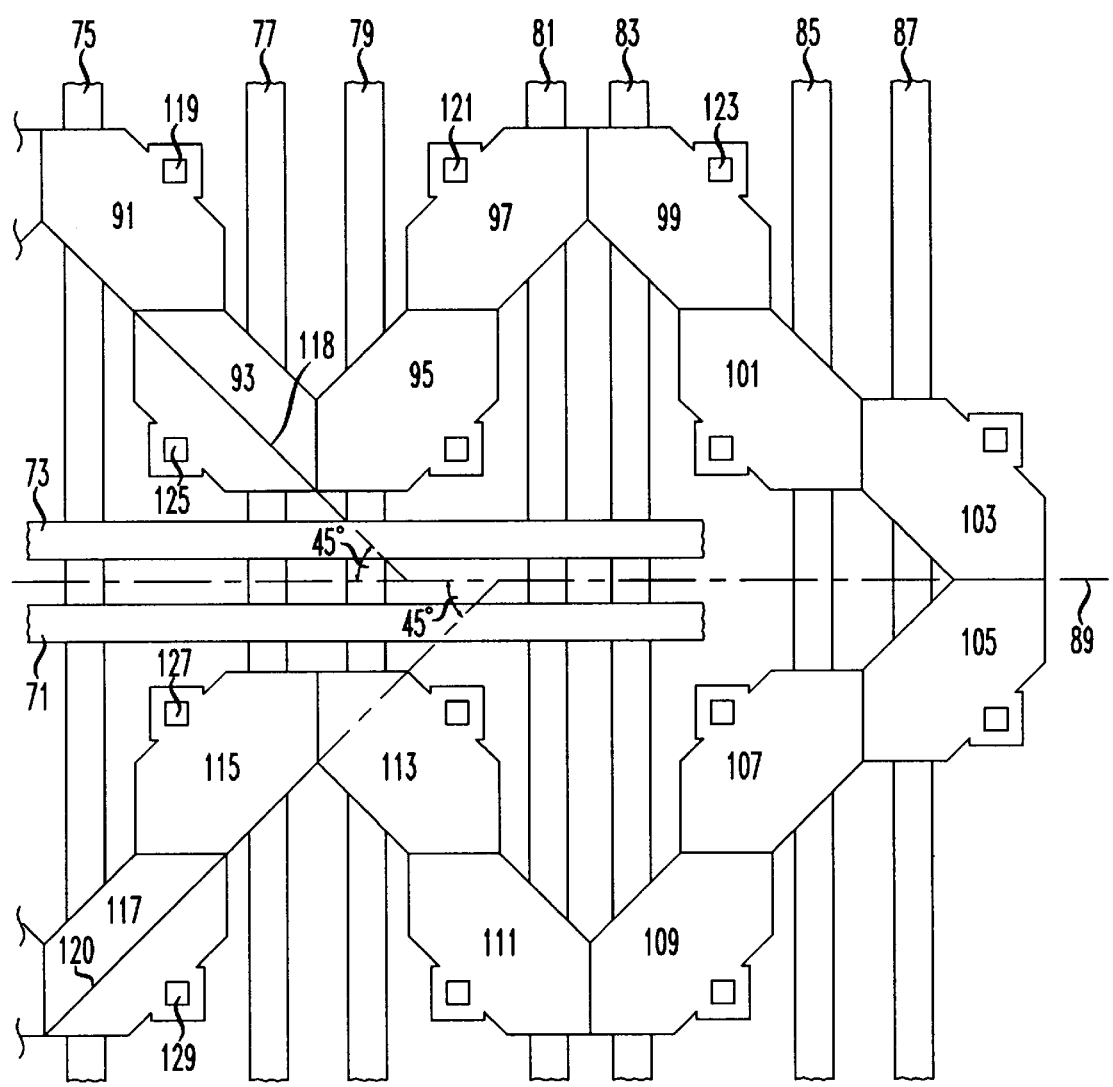
FIG. 3 shows a folding point portion of a resistor string in accordance with the invention.

FIG. 3 shows a portion of a resistor string according to the invention near a folding point. Also shown in FIG. 3 are row lines 71 and 73, and column lines 75, 77, 79, 81, 83, 85 and 87. These row and column lines, typically made of metal, polysilicon, or other materials as is known in the art, in conjunction with switching transistors, are used to selectively couple the taps to the output node and isolate the taps from the output node. The overall orientation of the string is parallel to axis 89, such that cells 91, 93, 95, 97, 99, 101 and 103 have an overall orientation running from left to right across the page parallel to axis 89. The folding point is where cells 103 and 105 join. After the folding point, cells 105, 107, 109, 111, 113, 115, 117, etc. have an orientation in the direction opposite the overall orientation, also parallel to axis 89, from right to left. The centerlines of cells 91–117 form non-orthogonal angles, preferably about 45 degree angles, with axis 89. Extensions of centerlines 118 and 120 of cells 93 and 117 are respectively shown, by way of example, intersecting axis 89 at an exemplary 45 degree angle. In practice, the resistor string will typically serpentine back and forth in this manner a plurality of times, passing through a folding point at each transition from running in one direction to running in the opposite direction.

The cells shown in FIG. 3 are organized into a plurality of substrings of at least two cells. For example, cells 91 and 93 comprise a first substring. Similarly, cells 95 and 97 comprise a second substring. Cells 99, 101 and 103 comprise a third substring. A fourth substring includes cells 105, 107 and 109. Cells 111 and 113 comprise a fifth substring, and cells 115 and 117 form a sixth substring. In accordance with the invention, substrings adjacent to a folding point comprise an odd number of cells, while substrings not adjacent to a folding point comprise and even number of cells. Preferably, for the most compact design, and as shown in FIG. 3, the substrings adjacent to a folding point comprise three cells, while those not adjacent to a folding point comprise two cells.

FIG. 3 also shows each substring having an orientation that is perpendicular to the orientation of adjacent substrings. For example, the 95, 97 substring has an orientation from lower left to upper right. This substring's orientation is perpendicular to the upper left to lower right orientations of the 91, 93 substring and the 99, 101, 103 substring. As further shown in FIG. 3, the taps preferably form a grid such that each tap is aligned with at least one other tap substantially parallel to the overall orientation, and is also aligned with at least one other tap substantially perpendicular to the overall orientation. For example, the overall orientation in FIG. 3 is characterized by axis 89. Tap 119 is aligned with taps 121 and 123 parallel to axis 89. Tap 119 is also aligned with taps 125, 127 and 129 perpendicular to axis 89. In the embodiment of FIG. 3, since column lines 75–87 are also perpendicular to axis 89, then taps 119, 125, 127 and 129 can also be characterized as being aligned parallel to the column lines.

Figure 4:
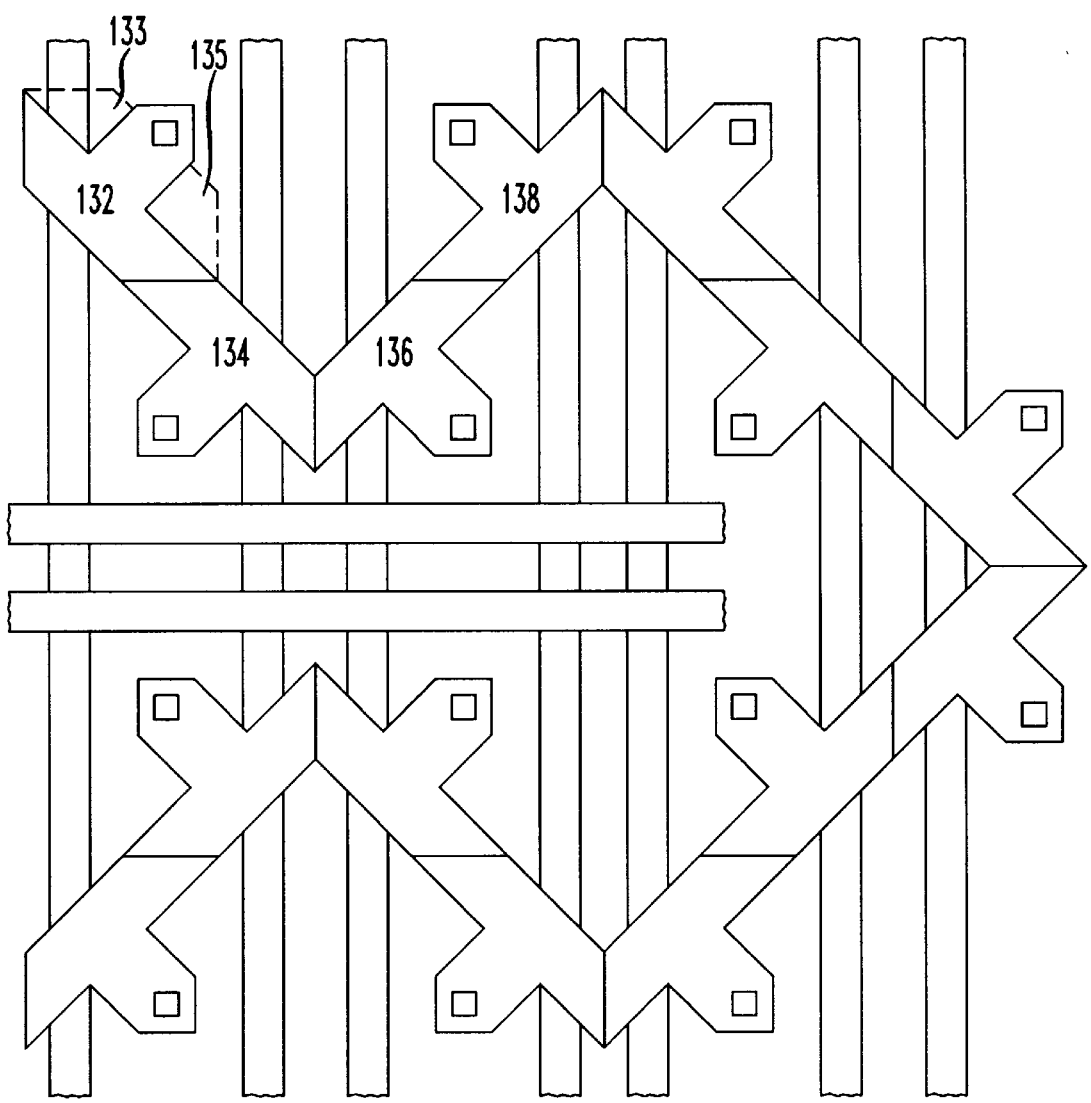
FIG. 4 shows an alternative cell structure in accordance with the invention.

In the illustrated embodiment discussed above, the cells have the shape of an extended hexagon. Alternatively-shaped cells can also be employed. For example, FIG. 4 shows an embodiment wherein the cells have trapezoidal shapes. This configuration is a variation on the embodiment of FIG. 3, and is based on the recognition that the circuit of FIG. 3 yields a current flow path that traverses each cell along the side of the cell opposite the cell's tap. Thus, one could modify the shape of the cells of FIG. 3 by carving away portions of the cells on the side opposite the current flow path (i.e. on the tap side). The embodiment of FIG. 4 is an extreme example of this, wherein all of the "unnecessary" portions of the hexagons are removed. For example, dashed lines show portions 133 and 135 that were removed from cell 132. Similar portions were removed from each of the other cells. As in the embodiment of FIG. 3, the cells are arranged in substrings that are perpendicular to each other. For example, cells 132 and 134 form a substring that is perpendicular to the substring formed by cells 136 and 138. Near the folding point, the substrings have an odd number of cells (i.e., 3) while away from the folding point the substrings have an even number of cells (i.e., 2).

Figure 5:
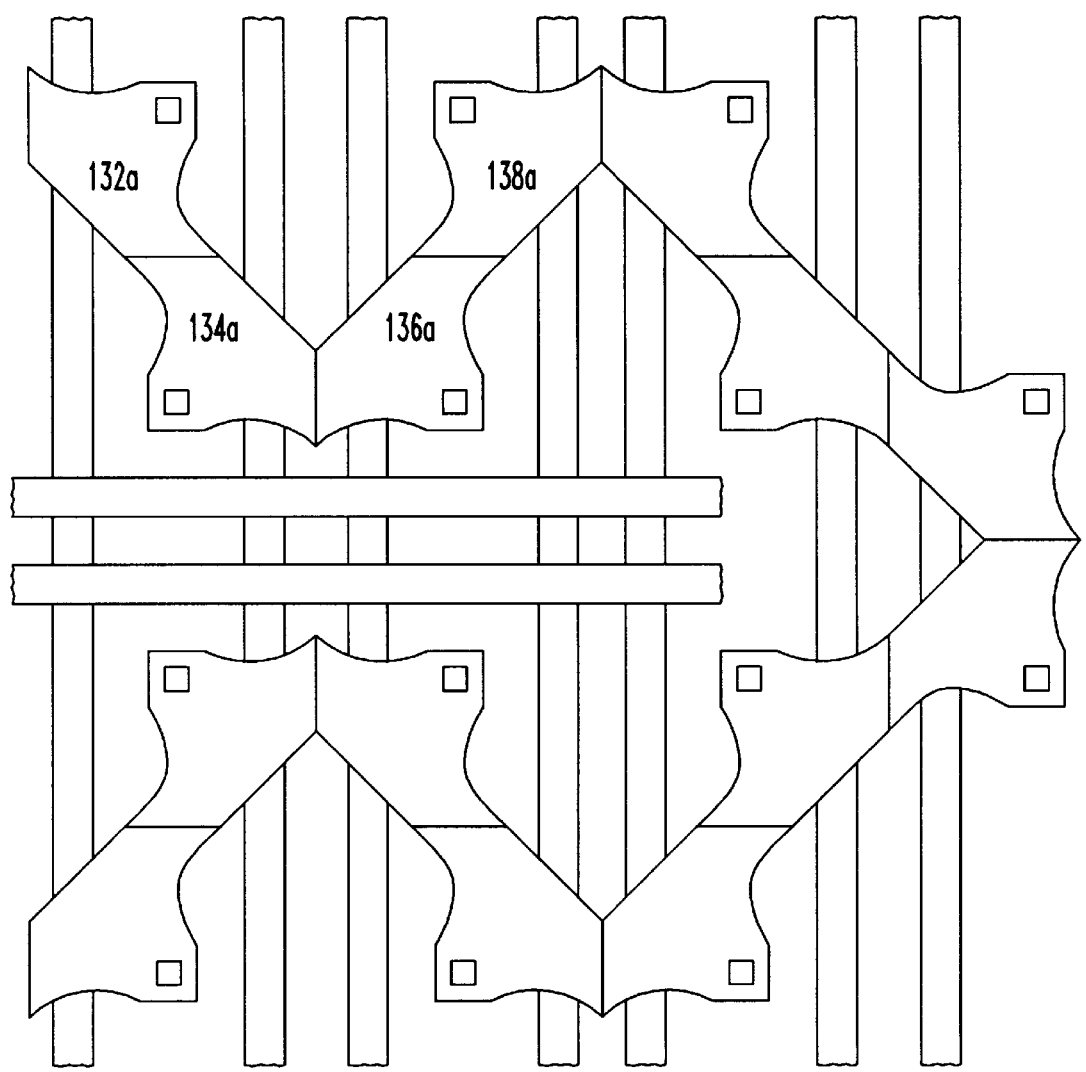
FIG. 5 shows another alternative cell structure in accordance with the invention.
Figure 6:
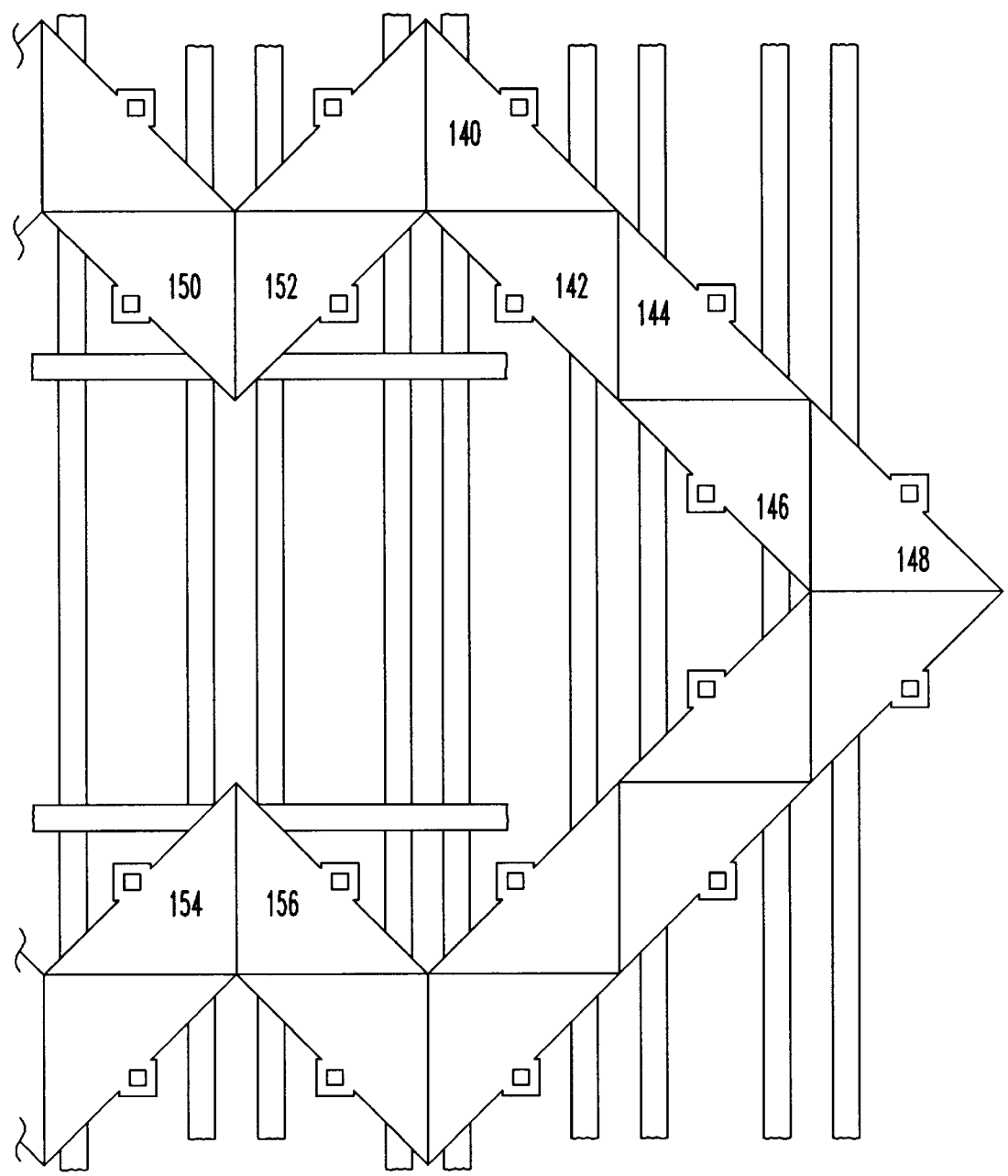
FIG. 6 shows still another alternative cell structure in accordance with the invention.

FIG. 5 is a less extreme example of the embodiment of FIG. 4. Portions of the hexagons that are away from the current flow, such as hexagons 132a, 134a, 136a and 138a, corresponding to hexagons 132–138 of FIG. 4, are rounded off. The embodiments of FIGS. 4 and 5 show two examples of modifications to the preferable shape of FIG. 3. Many other variations are possible, all falling within the scope of the invention. For example, FIG. 6 shows a portion of an embodiment wherein the cells are triangular in shape. A drawback of this implementation is that it mandates the use of five cells in the substrings near the folding points. The substring comprising cells 140, 142, 144, 146 and 148 is an example. If only three cells were used near the folding points in this implementation, the points of the triangular cells 150 and 152 would make contact with corresponding points of cells 154 and 156, rendering the resistor string inoperative. Thus, the FIG. 6 implementation may not be as compact as the previously described implementations.

Various alternative embodiments according to the invention are thus provided. One of skill in the art can clearly develop, based on the teachings herein, various other embodiments falling within the scope of the invention. A resistor string according to the embodiment shown in FIG. 3 has been tested with favorable results, achieving an integral linearity improved by a factor of two over a resistor string developed according to the teachings of Gross et al. Further, the resistor string according to the embodiment of FIG. 3 uses 40% less space than that used by a Gross et al. resistor string The resistors of the illustrative embodiment have been described as being fabricated of a metal such as aluminum. However, the invention is not so limited. The resistors may be fabricated at a predetermined level of integrated circuit fabrication. A resistor string may be fabricated as diffusion resistors, or fabricated of resistive materials such as doped or undoped polysilicon, metal such as aluminum or tungsten, or a layered combination of materials, such as, for example, polysilicon covered by metals such as aluminum or tungsten, or polysilicon covered by a nitride. Blanket layers may be deposited and then subsequently patterned in the shape desired.

One type of converter, specifically a digital-to analog converter, has been described as employing a resistor string according to the invention. However, the invention is also applicable to other types of converters, including, for example, analog-to-digital converters, including successive approximation and flash converters.

The invention claimed is:

1. An integrated circuit comprising a string of substantially similarly-shaped resistive cells, each cell comprising a first resistive portion and a second resistive portion, the string having an overall orientation and at least one cell having a centerline oriented at a non-orthogonal angle relative to the overall orientation, wherein the resistive cells have a substantially hexagonal shape having two longer sides substantially parallel to the centerline of the cell.

2. An integrated circuit as recited in claim 1, wherein substantially all of the cells have respective centerlines oriented at non-orthogonal angles relative to the overall orientation.

3. An integrated circuit as recited in claim 2, wherein each cell has a centerline oriented at a non-orthogonal angle relative to the overall orientation.

4. An integrated circuit as recited in claim 2, wherein the non-orthogonal angles are each about 45 degrees.

5. An integrated circuit as recited in claim 1, wherein the cells are contiguous such that a resistor is formed by the first resistive portion of one cell and the second resistive port on of an adjacent cell.

6. An integrated circuit as recited in claim 5, wherein the first resistive portion of the one cell comprises substantially one half of the resistor, and the second resistive portion of the adjacent cell comprises substantially another half of the resistor.

7. An integrated circuit as recited in claim 1, wherein the string includes at least one folding point after which a general orientation of subsequent cells in the string is opposite to a general orientation of preceding cells.

8. An integrated circuit as recited in claim 1, wherein each substantially hexagonal cell further includes four shorter sides.

9. An integrated circuit as recited in claim 8, wherein two adjacent cells are contiguous along shorter sides of the two adjacent cells.

10. An integrated circuit as recited in claim 9, wherein each cell has a corresponding tap centrally positioned along one of the cell's longer sides, a resistor being formed between the taps of any two adjacent cells.

11. An integrated circuit as recited in claim 10, wherein the taps are arranged to form a grid such that each tap is aligned with at least one other tap substantially parallel to the overall orientation and each tap is aligned with at least one other tap substantially perpendicular to the overall orientation.

12. An integrated circuit as recited in claim 9, wherein each of at least two cells has a corresponding tap centrally positioned along one of the cell's longer sides, a resistor being formed between any two adjacent taps, the resistance value of the resistor being a function of the number of resistive portions between the two adjacent taps.

13. An integrated circuit comprising a string of substantially similarly-shaped resistive cells, each cell comprising a first resistive portion and a second resistive portion, the string having an overall orientation and at least one cell having a centerline oriented at a non-orthogonal angle relative to the overall orientation, wherein the string of cells comprises a plurality of substrings, each substring comprising at least two cells.

14. An integrated circuit as recited in claim 13, wherein each substring has an orientation substantially perpendicular to an orientation of a substring adjacent thereto.

15. An integrated circuit as recited in claim 13, wherein substrings immediately adjacent to a folding point comprise an odd number of cells and substrings not adjacent to a folding point comprise an even number of cells.

16. An integrated circuit as recited in claim 13, wherein substrings immediately adjacent to a folding point comprise three cells and substrings not adjacent to a folding point comprise two cells.

17. An integrated circuit as recited in claim 13, wherein the resistive cells have a substantially hexagonal shape having two longer sides substantially parallel to the centerline of the cell.

18. A digital-to-analog converter comprising a string of substantially similarly-shaped resistive cells, each cell comprising a first resistive portion and a second resistive portion, the string having an overall orientation and substantially all of the cells having centerlines oriented at non-orthogonal angles relative to the overall orientation, wherein the resistive cells have a substantially hexagonal shape having two longer sides substantially parallel to the centerline.

19. A digital-to-analog converter as recited in claim 18, wherein the non-orthogonal angles are all about 45 degrees, wherein each cell has a substantially hexagonal shape with two longer sides and four shorter sides, wherein two adjacent cells are contiguous along shorter sides thereof, and wherein each cell has a tap centrally positioned along one of the cell's longer sides, a resistor being formed between the taps of two adjacent cells.

20. A digital-to-analog converter as recited in claim 19, wherein the taps form a grid such that each tap is aligned with at least one other tap substantially parallel to the overall orientation and each tap is aligned with at least one other tap substantially perpendicular to the overall orientation.

21. A digital-to-analog converter as recited in claim 18, wherein the cells are contiguous such that a resistor is formed by the first resistive portion of one cell and the second resistive portion of an adjacent cell, wherein the first resistive portion of the one cell comprises substantially one half of the resistor and the second resistive portion of the adjacent cell comprises substantially another half of the resistor, wherein the string includes a folding point after which a general orientation of subsequent cells in the string is opposite to a general orientation of preceding cells, wherein the string of cells comprises a plurality of substrings each comprising at least two cells, wherein each substring has an orientation substantially perpendicular to an orientation of a substring adjacent thereto, wherein substrings immediately adjacent folding points have an odd number of cells and wherein substrings not adjacent to folding points have an even number of cells.

22. An analog-to-digital converter comprising a string of substantially similarly-shaped resistive cells, each cell comprising a first resistive portion and a second resistive portion, the string having an overall orientation and substantially all of the cells having centerlines oriented at non-orthogonal angles relative to the overall orientation, wherein the resistive cells have a substantially hexagonal shape having two longer sides substantially parallel to the centerline.

23. An analog-to-digital converter as recited in claim 22, wherein the cells are contiguous such that a resistor is formed by the first resistive portion of one cell and the second resistive portion of an adjacent cell, wherein the first resistive portion of the one cell comprises substantially one half of the resistor and the second resistive portion of the adjacent cell comprises substantially another half of the resistor, wherein the string includes a folding point after which a general orientation of subsequent cells in the string is opposite to a general orientation of preceding cells, wherein the string of cells comprises a plurality of substrings each comprising at least two cells, wherein each substring has an orientation substantially perpendicular to an orientation of a substring adjacent thereto, wherein substrings immediately adjacent folding points have an odd number of cells and wherein substrings not adjacent to folding points have an even number of cells.

24. An analog-to-digital converter as recited in claim 22, wherein the non-orthogonal angles are all about 45 degrees, wherein each cell has a substantially hexagonal shape with two longer sides and four shorter sides, wherein two adjacent cells are contiguous along shorter sides thereof, and wherein each cell has a tap centrally positioned along one of the cell's longer sides, a resistor being formed between the taps of two adjacent cells.

25. An analog-to-digital converter as recited in claim 24, wherein the taps form a grid such that each tap is aligned with at least one other tap substantially parallel to the overall orientation and each tap is aligned with at least one other tap substantially perpendicular to the overall orientation.

* * * * *